US009368253B2

(12) United States Patent
Sumi et al.

(10) Patent No.: US 9,368,253 B2
(45) Date of Patent: Jun. 14, 2016

(54) ESD PROTECTION DEVICE AND METHOD FOR PRODUCING THE SAME

(71) Applicant: Murata Manufacturing Co., Ltd., Kyoto-fu (JP)

(72) Inventors: Takahiro Sumi, Kyoto-fu (JP); Jun Adachi, Kyoto-fu (JP); Takayuki Tsukizawa, Kyoto-fu (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 356 days.

(21) Appl. No.: 14/206,339

(22) Filed: Mar. 12, 2014

(65) Prior Publication Data

US 2014/0192447 A1  Jul. 10, 2014

Related U.S. Application Data

(63) Continuation of application No. PCT/JP2012/071519, filed on Aug. 26, 2012.

(30) Foreign Application Priority Data

Sep. 14, 2011  (JP) ................................ 2011-200090

(51) Int. Cl.
*H02H 1/00*      (2006.01)
*H01B 3/08*      (2006.01)
(Continued)

(52) U.S. Cl.
CPC .................. *H01B 3/08* (2013.01); *H01B 19/04* (2013.01); *H01T 1/20* (2013.01); *H01T 4/12* (2013.01);
(Continued)

(58) Field of Classification Search
CPC ........... H01J 11/12; H02H 9/04; H02H 9/046; G02F 2201/50; G02F 2202/22; G02F 2202/28; H05F 3/00; H05F 3/04; H05K 1/0259; H05K 9/0079; H01T 1/22
USPC ..................................... 361/56, 117, 212, 220
See application file for complete search history.

(56) References Cited

U.S. PATENT DOCUMENTS

2009/0067113 A1*  3/2009  Urakawa ................... H01T 4/12
                                                          361/220
2011/0286142 A1*  11/2011  Ikeda ....................... H01L 23/60
                                                          361/220

FOREIGN PATENT DOCUMENTS

EP         2242154 A1     10/2010
JP       2008-085284 A      4/2008
(Continued)

OTHER PUBLICATIONS

Written Opinion of the International Searching Authority for Application No. PCT/JP2012/071519 dated Sep. 25, 2012.
(Continued)

*Primary Examiner* — Danny Nguyen
(74) *Attorney, Agent, or Firm* — Pearne & Gordon LLP (57) ABSTRACT

An ESD protection device having high insulation reliability and good discharge properties is provided. In producing an ESD protection device that includes a first discharge electrode and a second discharge electrode arranged to oppose each other, a discharge supporting electrode formed so as to span between the first and second discharge electrodes, and an insulator substrate that retains the first and second discharge electrodes and the discharge supporting electrode, a paste for forming a discharge supporting electrode is used and this paste contains, in addition to a powder of an alkali metal compound and/or an alkaline earth metal compound, a metal powder with a network-forming oxide adhered to particle surfaces, a metal powder and a semiconductor powder with a network-forming oxide adhered to particle surfaces, or a metal powder with a network-forming oxide adhered to particle surfaces and a semiconductor powder with a network-forming oxide adhered to particle surfaces.

20 Claims, 4 Drawing Sheets

(51) Int. Cl.
  *H01T 1/20* (2006.01)
  *H01T 4/12* (2006.01)
  *H01T 21/00* (2006.01)
  *H01B 19/04* (2006.01)
  *H02H 9/04* (2006.01)
  *H05K 9/00* (2006.01)
  *H05F 3/04* (2006.01)
  *H05K 1/02* (2006.01)

(52) U.S. Cl.
  CPC ............... *H01T 21/00* (2013.01); *H02H 9/04* (2013.01); *H05F 3/04* (2013.01); *H05K 1/0259* (2013.01); *H05K 9/0079* (2013.01)

(56) References Cited

FOREIGN PATENT DOCUMENTS

WO  2009/098944 A1  8/2009
WO  2011/040437 A1  4/2011

OTHER PUBLICATIONS

International Search Report for Application No. PCT/JP2012/071519 dated Sep. 25, 2012.
Office Action issued in corresponding Japanese Patent Application No. 2013-533594 dated Oct. 14, 2014.

\* cited by examiner

ESD PROTECTION DEVICE AND METHOD FOR PRODUCING THE SAME

BACKGROUND OF THE INVENTION

1. Field of the Invention

The present invention relates to an electrostatic discharge (ESD) protection device and a method for producing the same. In particular, it relates to improvements of a discharge supporting electrode provided in an ESD protection device to promote electrostatic discharge.

2. Description of the Related Art

An overvoltage protection device which is of interest to the present invention is described in, for example, Japanese Unexamined Patent Application Publication No. 2008-85284 (Patent Document 1).

Patent Document 1 describes a material for an overvoltage protection device serving as a discharge supporting electrode for promoting discharge, the material containing a non-conductive powder (for example, silicon carbide with a particle diameter of 1 to 50 μm), a metal conductive powder (for example, copper with a particle diameter of 0.01 to 5 μm), and an adhesive (for example, a glass powder).

Patent Document 1 also describes a method for producing an overvoltage protection device, including a step of forming a material paste by evenly mixing a non-conductive powder, a metal conductive powder, and an adhesive at particular ratios, a step of applying the material paste onto a substrate by printing, and a step of subjecting the substrate to a firing treatment (temperature: 300° C. to 1200° C.)

However, according to the technology described in Patent Document 1 in which a glass powder is used as an adhesive, the glass component may become unevenly distributed depending on the dispersion state of the glass powder, possibly resulting in insufficient bonding between the metal conductive powder and the non-conductive powder. Accordingly, there is a problem in that shorting failure easily occurs especially in the event of high-voltage ESD.

Regarding this issue, International Publication No. 2011/040437 pamphlet (Patent Document 2) describes use of metal particles and semiconductor particles having a glass network-forming component on their surfaces, by which a glassy matter is generated and bonds between metal particles are formed. Compared to the technology described in Patent Document 1, the technology described in Patent Document 2 improves the dispersibility of the glass.

However, according to the technology described in Patent Document 2, generation of glass is insufficient and metal particles may not sufficiently bond to each other. If ESD occurs in such a case, shorting failure readily occurs.

Patent Document 1: Japanese Unexamined Patent Application Publication No. 2008-85284

Patent Document 2: International Publication No. 2011/040437 pamphlet

BRIEF SUMMARY OF THE INVENTION

Accordingly, an object of the present invention is to provide an ESD protection device that can address the challenges described above, in other words, an ESD protection device having high insulation reliability and good discharge properties, and a method for producing the ESD protection device.

The present invention is first directed to an ESD protection device that includes a first discharge electrode and a second discharge electrode arranged to oppose each other, a discharge supporting electrode formed so as to span between the first and second discharge electrodes, and an insulator substrate that retains the first and second discharge electrodes and the discharge supporting electrode. In order to solve the technical challenge described above, the discharge supporting electrode contains a plurality of metal particles and a glass that bonds between the metal particles and the glass contains an alkali metal component and/or an alkaline earth metal component.

The alkali metal component and/or alkaline earth metal component contained in the glass is to serve as a network-modifying component that facilitates generation of glass and consequently remains in the glass generated.

When a network-forming oxide is adhered to surfaces of the metal particles contained in the discharge supporting electrode, the metal particles can be more strongly bonded to each other and thus the reliability of the ESD protection device can be enhanced.

The discharge supporting electrode preferably further contains silicon carbide. Since silicon carbide is a semiconductor, the insulation reliability of the ESD protection device can be improved. On surfaces of silicon carbide, for example, in a firing process, $SiO_2$ which is a network-forming oxide is generated. This $SiO_2$ and the network-forming oxide sometimes adhering to the particle surfaces of the metal powder react with the alkali metal component and/or alkaline earth metal component serving as a network-modifying component so as to generate a glass. This glass contributes to forming stronger bonds between the metal particles, between the silicon carbide particles, or between the metal particles and silicon carbide particles.

The metal particles are preferably composed of copper or a copper alloy containing copper as a main component. In this manner, an ESD protection device can be offered at a relatively low cost. Moreover, since copper has a relatively high melting point, the insulation reliability during discharge can be further improved. This is because a low melting point leads to melting of metal particles by heat generated during discharging, possibly resulting in shorting.

In the ESD protection device of the present invention, the first and second discharge electrodes and the discharge supporting electrode are preferably positioned inside the insulator substrate, the insulator substrate preferably has a cavity where a gap between the first and second discharge electrodes lies, and the ESD protection device preferably further includes a first outer terminal electrode and a second outer terminal electrode which are formed on surfaces of the insulator substrate and respectively electrically connected to the first and second discharge electrodes. According to this structure, moisture resistance of the ESD protection device can be improved.

The present invention is also directed to a method for producing an ESD protection device.

A method for producing an ESD protection device according to the present invention includes a step of preparing an insulator substrate, a step of preparing a discharge supporting electrode paste, a step of forming a green discharge supporting electrode formed of the discharging supporting electrode paste on a surface of or inside the insulator substrate, a step of forming a first discharge electrode and a second discharge electrode on a surface of or inside the insulator substrate so that the first and second discharge electrodes are opposed to each other on the discharge supporting electrode, and a step of firing the green discharge supporting electrode. The method has the following features.

The method for producing an ESD protection device according to the present invention addressing the technical challenge described above is characterized in that the discharge supporting electrode paste contains, in addition to a powder of an alkali metal compound and/or an alkaline earth metal compound, (1) a metal powder with a network-forming oxide adhered to particle surfaces, (2) a metal powder and a semiconductor powder with a network-forming oxide adhered to particle surfaces, or (3) a metal powder with a network-forming oxide adhered to particle surfaces and a semiconductor powder with a network-forming oxide adhered to particle surfaces.

The order of performing the step of forming a discharge supporting electrode and the step of forming a first discharge electrode and a second discharge electrode may be any.

When the discharge supporting electrode paste contains a semiconductor powder as in the case of (2) or (3) above, the semiconductor powder is preferably a silicon carbide powder. This is because, as mentioned earlier, silicon carbide is a semiconductor and can thus improve the insulation reliability of the ESD protection device. Moreover, in the firing process, $SiO_2$ that serves as a network-forming oxide is generated at surfaces of the silicon carbide powder and this $SiO_2$ and the network-forming oxide sometimes adhering to the particle surfaces of the metal powder react with the alkali metal compound and/or alkaline earth metal compound serving as a network-modifying component so as to give a glass. Thus, compared to the cases where the silicon carbide powder is not contained, stronger bonds are formed between the metal particles, between the silicon carbide particles, and or between the metal particles and the silicon carbide particles, and as a result an ESD protection device having higher reliability can be offered.

The alkali metal compound and the alkaline earth metal compound contained in the discharge supporting electrode paste are preferably carbonates. This is because carbonates are easy to handle and to be processed into pastes.

When the alkali metal compound and/or the alkaline earth metal compound are contained in the discharge supporting electrode paste as in the embodiment described above, the total content of the alkali metal carbonate and the alkaline earth metal carbonate in the discharge supporting electrode paste is preferably 0.2% to 2.5% by weight. This is because, at a total content outside this range, the reliability of the ESD protection device may be degraded depending on the firing conditions and the like and structural defects such as cracking and blistering may occur in the discharge supporting electrode.

In a preferred embodiment of the method for producing an ESD protection device according to the present invention, the step of preparing an insulator substrate includes a step of preparing a plurality of ceramic green sheets including a first ceramic green sheet and a second ceramic green sheet. In this case, the step of forming a green discharge supporting electrode and the step of forming a first discharge electrode and a second discharge electrode are performed on the first ceramic green sheet. Moreover, according to this preferred embodiment, the method further includes a step of forming a combustibly removable layer so as to cover a gap between the first and second discharge electrodes, a step of obtaining the insulator substrate in a green state by stacking the second ceramic green sheet on the first ceramic green sheet so as to cover the green discharge supporting electrode, the first and second discharge electrodes, and the combustibly removable layer, and a step of forming a first outer terminal electrode and a second outer terminal electrode, which are respectively electrically connected to the first and second discharge electrodes, on surfaces of the insulator substrate. In the firing step, the insulator substrate is obtained by sintering the ceramic green sheets and the combustibly removable layer is combustibly removed.

According to the ESD protection device according to the present invention, the discharge supporting electrode has a structure in which metal particles are bonded to each other with a glass. Since the glass contains an alkali metal component and/or an alkaline earth metal component that has served as a network modifying oxide, a sufficient amount of glass is generated and thus the bonds between the metal particles exhibit sufficient strength.

According to the method for producing an ESD protection device according to the present invention, the discharge supporting electrode paste contains an alkali metal compound and/or an alkaline earth metal compound that serves as a network-modifying component in addition to a network-forming oxide on the particle surfaces of the metal powder and/or the semiconductor powder. Thus, the glass can be easily generated. Thus, the metal particles can bond to each other with sufficient strength and as a result an ESD protection device having high reliability can be offered.

In the case where the network-forming oxide is adhered to particle surfaces of the metal powder, the glass can be easily formed over the entire particle surfaces of the metal powder and the network-forming oxide functions as an electrical insulating layer. Thus, the insulation reliability of the ESD protection device is improved, and creeping discharge easily occurs and the peak voltage can be decreased since the glass bonds the metal particles to one another with a short distance between the metal particles.

DETAILED DESCRIPTION OF THE INVENTION

Figure 1:
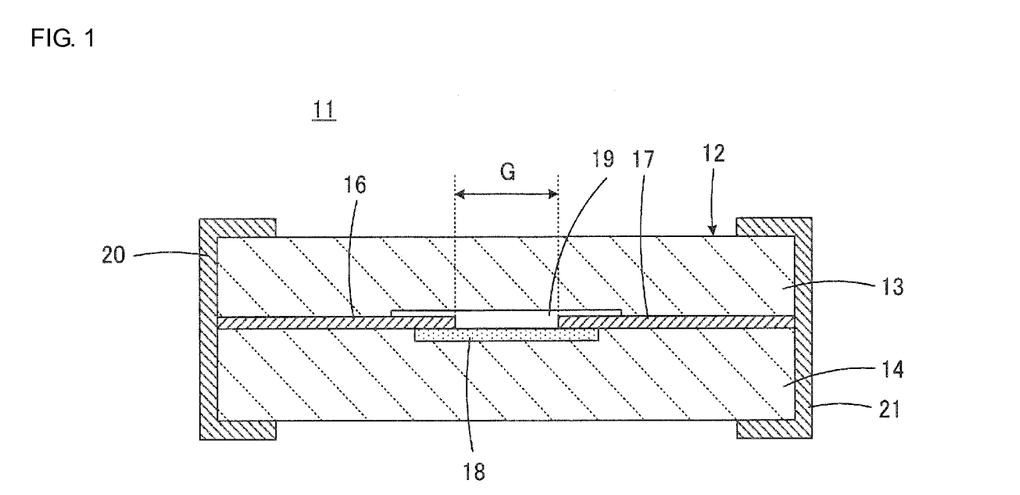
FIG. 1 is a cross-sectional view of an ESD protection device 11 according to a first embodiment of the present invention.

An ESD protection device 11 according to a first embodiment of the present invention will now be described with reference to FIG. 1.

The ESD protection device 11 includes an insulator substrate 12. The insulator substrate 12, for example, is composed of a low-temperature co-fired ceramic (LTCC) such as glass ceramic, high-temperature co-fired ceramic (HTCC) such as aluminum nitride or alumina, or a magnetic ceramic such as ferrite. The insulator substrate 12 has a layered structure that includes at least an upper layer portion 13 and a lower layer portion 14.

A first discharge electrode 16, a second discharge electrode 17, and a discharge supporting electrode 18 are disposed inside the insulator substrate 12 and between the upper layer portion 13 and the lower layer portion 14. The first discharge electrode 16 and the second discharge electrode 17 are opposed to each other with a particular gap G therebetween and the discharge supporting electrode 18 spans between the first discharge electrode 16 and the second discharge electrode 17. The portion where the gap G is located in the insulator substrate 12 is a cavity 19.

A first outer terminal electrode 20 and a second outer terminal electrode 21 are formed on outer surfaces of the insulator substrate 12. The first outer terminal electrode 20 and the second outer terminal electrode 21 are respectively electrically connected to the first discharge electrode 16 and the second discharge electrode 17.

In the ESD protection device 11, the discharge supporting electrode 18 contains a plurality of metal particles and a glass bonding between the metal particles. The glass contains an alkali metal component and/or an alkaline earth metal component.

Copper or a copper alloy containing copper as a main component is preferably used as the metal constituting the metal particles. Alternatively, silver, aluminum, molybdenum, tungsten, or the like may be used.

The ESD protection device 11 is produced as follows, for example.

First, ceramic green sheets that form an insulator substrate 12 are prepared. Of these ceramic green sheets, a first ceramic green sheet is used for forming, for example, a lower layer portion 14 of the insulator substrate 12, and a second ceramic green sheet is used for forming an upper layer portion 13.

A discharge supporting electrode paste is prepared in order to form a discharge supporting electrode 18. The discharge supporting electrode paste contains, in addition to a powder of an alkali metal compound and/or an alkaline earth metal compound, (1) a metal powder with a network-forming oxide adhered to particle surfaces, (2) a metal powder and a semiconductor powder with a network-forming oxide adhered to particle surfaces, or (3) a metal powder with a network-forming oxide adhered to particle surfaces and a semiconductor powder with a network-forming oxide adhered to particle surfaces.

Examples of the network-forming oxide include $SiO_2$, $B_2O_3$, $Al_2O_3$, $P_2O_5$, $ZrO_2$, $V_2O_5$, $TiO_2$, ZnO, $GeO_2$, $As_2O_5$, $Sb_2O_5$, PbO, and BeO.

In the case of (1) above, a semiconductor powder is not contained. In the case of (2) or (3) where a semiconductor powder is contained, a silicon carbide powder is preferably used as the semiconductor powder. When a silicon carbide powder is contained, $SiO_2$ is formed as a network-forming oxide on surfaces of the silicon carbide powder in the firing process. This $SiO_2$ and the network-forming oxide adhered to particle surfaces of the metal powder in the case (3) react with the alkali metal compound and/or alkaline earth metal compound that serves as network modifying component to give a glass. Accordingly, compared to the cases where no silicon carbide powder is contained, stronger bonds are formed between the metal particles, between the silicon carbide particles, or between the metal particles and the silicon carbide particles. This and the fact that the silicon carbide is a semiconductor contribute to improving the insulation reliability of the ESD protection device 11.

When the network-forming oxide is adhered to particle surfaces of a metal powder as in the case of (1) or (3) mentioned above, a glass is readily formed over the entire particle surfaces of the metal powder in the firing step described below, and the network-forming oxide functions as an electrically insulating layer. Thus, the insulation reliability of the ESD protection device 11 is improved. In addition, since glass bonds the metal particles to each other with a short distance between the metal particles, creeping discharge readily occurs and thus the peak voltage can be decreased.

From the viewpoints of ease of handling and ease of forming pastes, the alkali metal compound and the alkaline earth metal compound are preferably carbonates.

Next, a green paste film that has a particular pattern and that will form a discharge supporting electrode 18 is formed on the first ceramic green sheet by using the discharge supporting electrode paste.

Then a first discharge electrode 16 and a second discharge electrode 17 are formed on the first ceramic green sheet and on the green paste film, which is to be a discharge supporting electrode 18, so that the electrodes are opposed to each other with a particular gap G therebetween. The first discharge electrode 16 and the second discharge electrode 17 are formed by, for example, applying a conductive paste.

Next, a combustibly removable layer is formed so as to cover the gap G between the first discharge electrode 16 and the second discharge electrode 17. The combustibly removable layer is combusted in the firing step described below so as to leave the cavity 19 inside the insulator substrate 12. The combustibly removable layer is formed by, for example, a paste containing resin beads.

The pastes respectively used for forming the discharge supporting electrode 18, the first discharge electrode 16, the second discharge electrode 17, and the combustibly removable layer may be directly applied onto a target object or by a transfer method or the like.

Next, the second ceramic green sheet is stacked on and press-bonded with the first ceramic green sheet so as to cover the green discharge supporting electrode 18, the first discharge electrode 16, the second discharge electrode 17, and the combustibly removable layer. As a result, a green insulator substrate 12 is obtained.

Then a first outer terminal electrode 20 and a second outer terminal electrode 21 are formed on surfaces of the green insulator substrate 12. The outer terminal electrodes 20 and 21 can be, for example, formed by applying a conductive paste.

Then a firing step is performed. In the firing step, the ceramic green sheets are sintered into an insulator substrate 12 and the discharge electrode 16, the discharge electrode 17, the discharge supporting electrode 18, the outer terminal electrodes 20 and 21 become sintered.

In the firing step described above, the network-forming oxide on the particle surfaces of the metal powder and/or semiconductor powder contained in the discharge supporting electrode paste that forms the green discharge supporting electrode 18 reacts with the alkali metal compound and/or alkaline earth metal compound serving as a network-modifying component so as to generate a glass. This glass strongly bonds the metal particles to each other. In the case where a semiconductor powder is contained, semiconductor particles become strongly bonded to each other with glass and the metal particles are strongly bonded to semiconductor particles with glass.

In the firing step, the combustibly removable layer is combusted and a cavity 19 is formed inside the insulator substrate 12.

Thus, an ESD protection device 11 is fabricated.

Note that in the case where copper or a copper alloy is used as the metal constituting the metal particles and the discharge supporting electrode 18 is co-fired with the insulator substrate 12, the insulator substrate 12 is preferably composed of LTCC.

Figure 2:
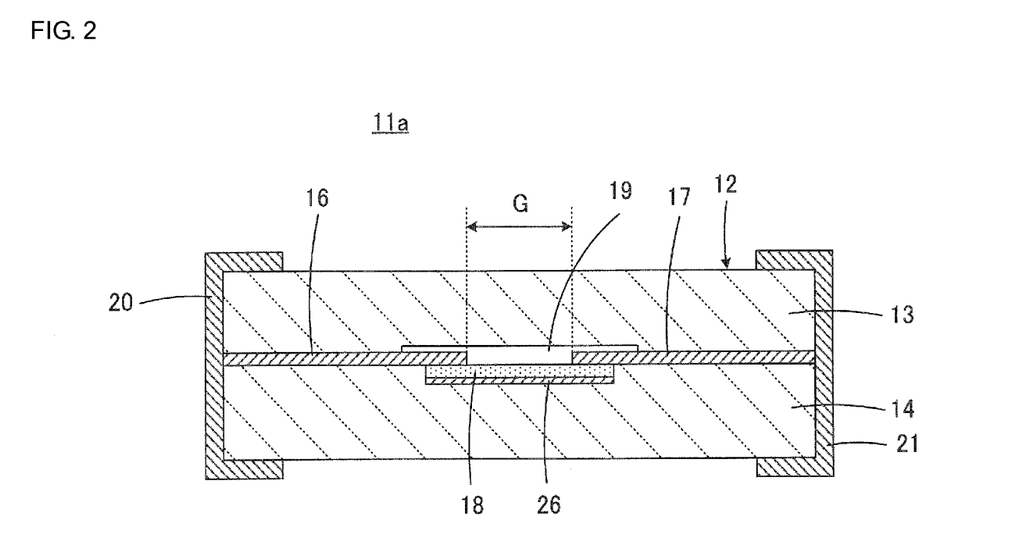
FIG. 2 is a cross-sectional view of an ESD protection device 11a according to a second embodiment of the present invention.

FIG. 2 shows an ESD protection device 11a according to a second embodiment of the present invention. In FIG. 2, the components equivalent to those shown in FIG. 1 are referred to by the same reference signs and description therefor is omitted to avoid redundancy.

The ESD protection device 11a shown in FIG. 2 is characterized in that a protection layer 26 composed of, for example, $Al_2O_3$, is formed along the interface between the discharge supporting electrode 18 and the insulator substrate 12. This structure is particularly effective when the insulator substrate 12 is composed of LTCC or a magnetic ceramic. In other words, in the case where the insulator substrate 12 is composed of LTCC, the protection layer 26 prevents diffusion and penetration of the glass component from the insulator substrate 12 into the discharge supporting electrode 18 in the firing step and prevents deterioration of the insulating properties of the discharge supporting electrode 18. In the case where the insulator substrate 12 is composed of a magnetic ceramic, the protection layer 26 prevents reduction of the magnetic ceramic material under application of ESD and deterioration of the insulating properties of the insulator substrate 12.

The following modification examples are also within the scope of the present invention.

Although the discharge electrodes 16 and 17 and the discharge supporting electrode 18 are disposed inside the insulator substrate 12 in the illustrated embodiment, they may alternatively be disposed on outer surfaces of the insulator substrate.

Even in the case where the discharge electrodes 16 and 17 and the discharge supporting electrode 18 are disposed inside the insulator substrate 12, the cavity 19 need not always be formed.

The ESD protection device 11a may be built inside a board along with other functional devices.

Although firing for sintering the insulator substrate 12 is performed at the same time as firing for sintering the discharge electrodes 16 and 17 and the discharge supporting electrode 18 in the production method described above, an insulator substrate composed of a sintered ceramic may be preliminarily prepared and discharge electrodes and a discharge supporting electrode may be formed on this insulator substrate.

Next, Experimental Example performed to confirm the effects of the present invention is described.

EXPERIMENTAL EXAMPLE

<Preparation of Evaluation Samples>
(1) Preparation of Ceramic Green Sheets Materials respectively containing Ba, Al, and Si as a main component were prepared as ceramic materials. The materials were blended to a particular composition and the resulting mixture was calcined at 800° C. to 1000° C. The calcined powder was pulverized for 12 hours in a zirconia ball mill to obtain a ceramic powder.

An organic solvent containing toluene and ekinen was added to the ceramic powder and the resulting mixture was mixed. A binder and a plasticizer were further added to the mixture and the resulting mixture was mixed again to obtain a slurry.

The slurry was formed into ceramic green sheets having a thickness of 50 μm by a doctor blade method. One of the ceramic green sheets prepared here is illustrated as a ceramic green sheet 31 in FIGS. 3 to 7. Another one of the ceramic green sheets is illustrated as a ceramic green sheet 36 in FIGS. 6 and 7.

(2) Preparation of Discharge Supporting Electrode Paste

Two metal powders, M-1 and M-2, in which the metal type was Cu and the particle surfaces were coated with a network-forming oxide were prepared as the metal powder as described in Table 1.

TABLE 1

| Metal powder No. | Metal type | Network-forming oxide type | Particle diameter (μm) | Coating amount (wt %) |
|---|---|---|---|---|
| M-1 | Cu | $Al_2O_3$ | 3 | 5 |
| M-2 | Cu | $SiO_2$ | 3 | 5 |

A SiC powder having a particle diameter of 0.5 μm was prepared as a semiconductor powder.

Two alkali metal compounds, R2O-1 and R2O-2, shown in Table 2 were prepared as the alkali metal compound.

TABLE 2

| Alkali metal compound No. | Molecular formula |
|---|---|
| R2O-1 | $Na_2CO_3$ |
| R2O-2 | $K_2CO_3$ |

Two alkaline earth metal compounds RO-1 and RO-2 shown in Table 3 were prepared as the alkaline earth metal compound.

TABLE 3

| Alkaline earth metal compound No. | Molecular formula |
|---|---|
| RO-1 | $MgCO_3$ |
| RO-2 | $BaCO_3$ |

Three glass frits, GF-1 to GF-3, shown in Table 4 were prepared as the glass frit.

TABLE 4

| Glass frit No. | Composition | Softening point (° C.) | Particle diameter (μm) |
|---|---|---|---|
| GF-1 | Alkali borosilicate | 760 | 1 |
| GF-2 | Alkali borosilicate | 855 | 1 |
| GF-3 | Alkali borosilicate | 920 | 1 |

An organic vehicle was obtained by dissolving an ETHOCEL® (ethyl cellulose) resin having a weight-average molecular weight of $5×10^4$ and an alkyd resin having a weight-average molecular weight of 8×10³ in terpineol. In the organic vehicle, the ETHOCEL® (ethyl cellulose) resin content was 9.0% by weight, the alkyd resin content was 4.5% by weight, and the terpineol content was 86.5% by weight.

Next, the metal powder shown in Table 1, a SiC powder serving as the semiconductor powder, the alkali metal compound powder shown in Table 2, the alkaline earth metal powder shown in Table 3, the glass frit shown in Table 4, and the organic vehicle were blended so that the volume percents shown in Table 5 were satisfied. Each resulting mixture was subjected to a dispersion treatment by using a three-roll mill. As a result, discharge supporting electrode pastes S-1 to S-27 were obtained.

alkali borosilicate glass frit having a transition point of 620° C., a softening point of 720° C., and an average particle diameter of about 1 μm, and 15% by weight of an organic vehicle obtained by dissolving ethyl cellulose in terpineol. The resulting mixture was mixed by a three-roll mill so as to prepare an outer terminal electrode paste.

(6) Printing of Pastes

Figure 3:
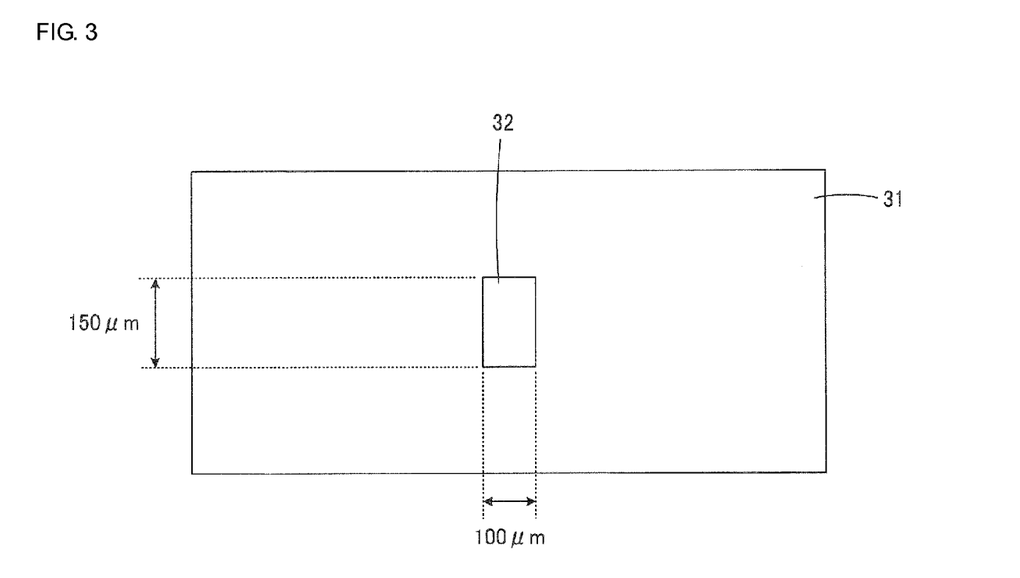
FIG. 3 is a plan view illustrating a step of producing an ESD protection device 42 prepared in Experimental Example, in which a green discharge supporting electrode 32 is formed on a ceramic green sheet 31.

First, as shown in FIG. 3, the discharge supporting electrode paste was applied on one main surface of the ceramic green sheet 31 so as to form a green discharge supporting electrode 32 of 150 μm×100 μm in size. One of the discharge supporting electrode pastes S-1 to S27 having various compositions shown in Table 5 was used as the discharge support-

TABLE 5

| Discharge supporting electrode paste No. | Metal powder | | SiC powder | Alkali metal compound | | Alkaline earth metal compound | | Glass frit | | | Organic vehicle |
|---|---|---|---|---|---|---|---|---|---|---|---|
| | M-1 | M-2 | | R2O-1 | R2O-2 | RO-1 | RO-2 | GF-1 | GF-2 | GF-3 | |
| * S-1 | 12.0 | — | 3.0 | 0.0 | — | — | — | — | — | — | 85.0 |
| S-2 | 12.0 | — | 3.0 | 0.2 | — | — | — | — | — | — | 84.8 |
| S-3 | 12.0 | — | 3.0 | 0.5 | — | — | — | — | — | — | 84.5 |
| S-4 | 12.0 | — | 3.0 | 1.0 | — | — | — | — | — | — | 84.0 |
| S-5 | 12.0 | — | 3.0 | 1.5 | — | — | — | — | — | — | 83.5 |
| S-6 | 12.0 | — | 3.0 | 2.0 | — | — | — | — | — | — | 83.0 |
| S-7 | 12.0 | — | 3.0 | 2.5 | — | — | — | — | — | — | 82.5 |
| S-8 | 12.0 | — | 3.0 | — | 0.5 | — | — | — | — | — | 84.5 |
| S-9 | — | 12.0 | 3.0 | 0.5 | — | — | — | — | — | — | 84.5 |
| S-10 | 12.0 | — | 3.0 | 0.3 | — | 0.2 | — | — | — | — | 84.5 |
| S-11 | 12.0 | — | 3.0 | — | — | 0.2 | — | — | — | — | 84.8 |
| S-12 | 12.0 | — | 3.0 | — | — | 0.5 | — | — | — | — | 84.5 |
| S-13 | 12.0 | — | 3.0 | — | — | 1.0 | — | — | — | — | 84.0 |
| S-14 | 12.0 | — | 3.0 | — | — | 1.5 | — | — | — | — | 83.5 |
| S-15 | 12.0 | — | 3.0 | — | — | 2.0 | — | — | — | — | 83.0 |
| S-16 | 12.0 | — | 3.0 | — | — | 2.5 | — | — | — | — | 82.5 |
| S-17 | 12.0 | — | 3.0 | — | — | — | 0.5 | — | — | — | 84.5 |
| S-18 | — | 12.0 | — | — | 0.5 | — | — | — | — | — | 87.5 |
| * S-19 | 12.0 | — | 3.0 | — | — | — | — | 0.5 | — | — | 84.5 |
| * S-20 | 12.0 | — | 3.0 | — | — | — | — | 1.0 | — | — | 84.0 |
| * S-21 | 12.0 | — | 3.0 | — | — | — | — | 2.0 | — | — | 83.0 |
| * S-22 | 12.0 | — | 3.0 | — | — | — | — | — | 0.5 | — | 84.5 |
| * S-23 | 12.0 | — | 3.0 | — | — | — | — | — | 1.0 | — | 84.0 |
| * S-24 | 12.0 | — | 3.0 | — | — | — | — | — | 2.0 | — | 83.0 |
| * S-25 | 12.0 | — | 3.0 | — | — | — | — | — | — | 0.5 | 84.5 |
| * S-26 | 12.0 | — | 3.0 | — | — | — | — | — | — | 1.0 | 84.0 |
| * S-27 | 12.0 | — | 3.0 | — | — | — | — | — | — | 2.0 | 83.0 |

In Table 5, the sample numbers of the samples outside the scope of the present invention are asterisked.

(3) Preparation of Discharge Electrode Paste

Blended were 40% by weight of a Cu powder having an average particle diameter of 1 μm, 40% by weight of a Cu powder having an average particle diameter of 3 μm, and 20% by weight of an organic vehicle prepared by dissolving ethyl cellulose in terpineol. The resulting mixture was mixed by a three-roll mill to obtain a discharge electrode paste.

(4) Preparation of Combustibly Removable Layer Resin Bead Paste

A resin bead paste for forming a combustibly removable layer that is combustibly removed upon firing to form a cavity was prepared. Blended were 38% by weight of crosslinked acrylic resin beads having an average particle diameter of 1 μm and 62% by weight of an organic vehicle prepared by dissolving ethyl cellulose in dihydroterpinyl acetate, and the resulting mixture was mixed by a three-roll mill to obtain a combustibly removable layer resin bead paste.

(5) Preparation of Outer Terminal Electrode Paste

Blended were 80% by weight of a Cu powder having an average particle diameter of about 1 μm, 5% by weight of an ing electrode paste as shown in the "Discharge supporting electrode paste" column in Table 6.

Figure 4:
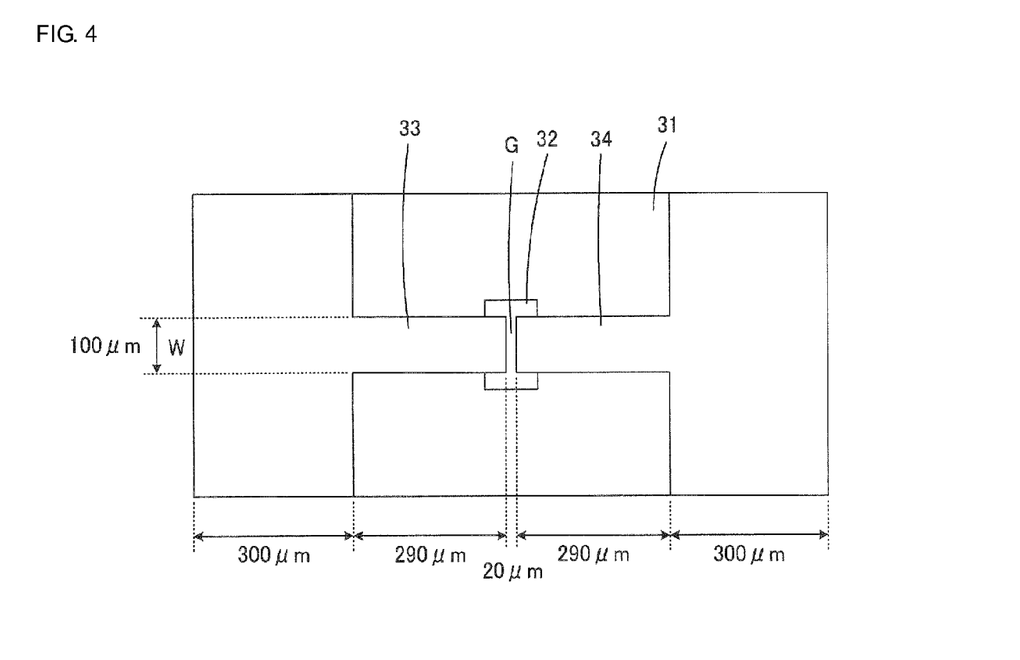
FIG. 4 is a plan view illustrating a step of producing the ESD protection device 42 prepared in Experimental Example, in which a first green discharge electrode 33 and a second green discharge electrode 34 are formed after the step illustrated in FIG. 3.

Next, the discharge electrode paste was applied to the main surface of the ceramic green sheet 31 so as to overlap a part of the green discharge supporting electrode 32. As a result, a first green discharge electrode 33 and a second green discharge electrode 34 were formed as shown in FIG. 4. The first green discharge electrode 33 and the second green discharge electrode 34 are opposed to each other with a gap G of 20 μm therebetween on the green discharge supporting electrode 32. The width W of the opposing portions was set to 100 μm. FIG. 4 illustrates measurements of other parts also.

Figure 5:
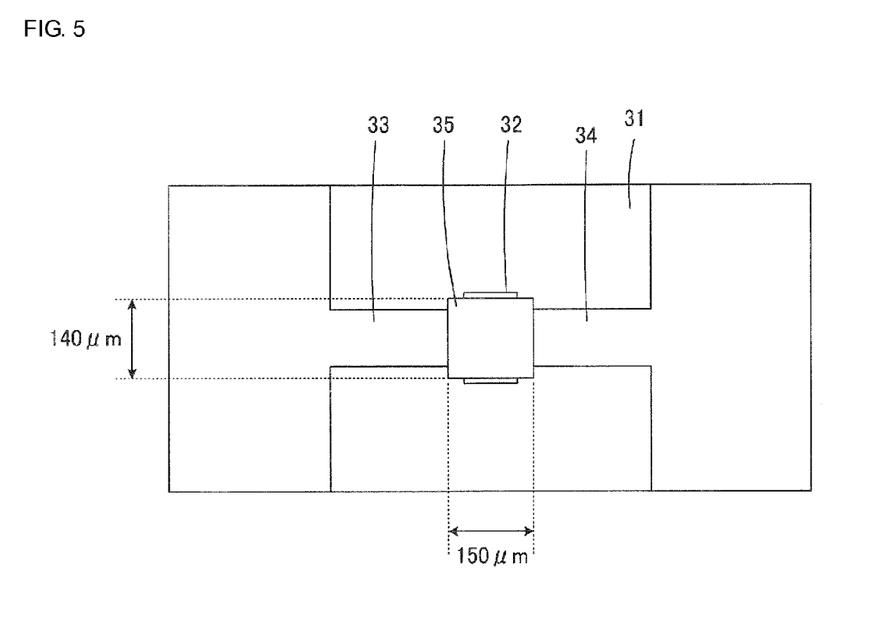
FIG. 5 is a plan view illustrating a step of producing the ESD protection device 42 prepared in Experimental Example, in which a green combustibly removable layer 35 is formed after the step illustrated in FIG. 4.

Next, as shown in FIG. 5, the combustibly removable layer resin bead paste was applied so as to cover the gap G between the first green discharge electrode 33 and the second green discharge electrode 34 and to form a green combustibly removable layer 35 140 μm×150 μm in size.

(7) Stacking and Press Bonding

Figure 6:
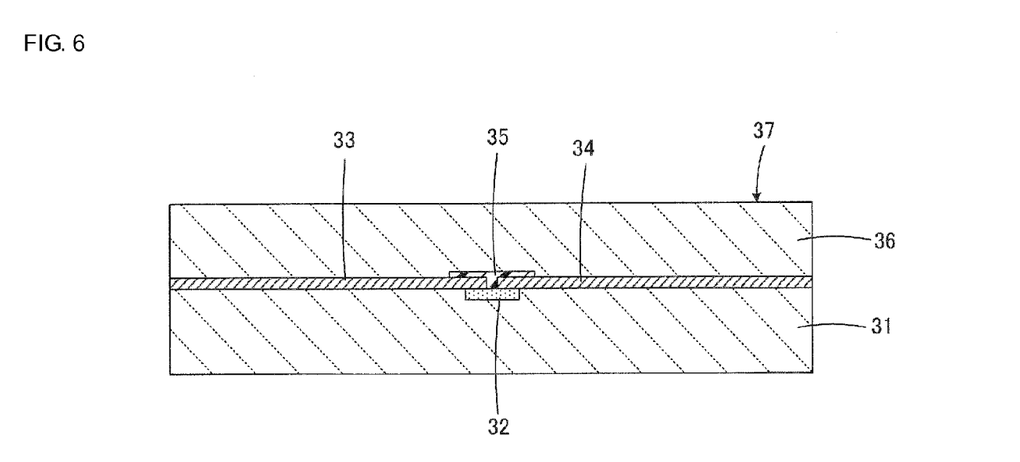
FIG. 6 is a cross-sectional view illustrating a step of producing the ESD protection device 42 prepared in Experimental Example, in which a second ceramic green sheet 36 is stacked after the step illustrated in FIG. 5.

Referring to FIG. 6, a plurality of ceramic green sheets 36 on which no paste was applied were stacked on and press-bonded with the main surface of the ceramic green sheet 31 on which the green discharge supporting electrode 32, the green discharge electrodes 33 and 34, and the green combustibly removable layer 35 were formed. As a result, a green insulator substrate 37 was obtained. The green insulator substrate 37 was adjusted so that the thickness thereof after firing was to be 0.3 mm.

(8) Cutting and Printing of Outer Terminal Electrode Paste

The insulator substrate 37 was cut with a micro-cutter so that the dimension in plan view after firing was to be 1.0 mm×0.5 mm. It should be understood that the measurements shown in FIG. 4 and the contours of the ceramic green sheet 31 and the like shown in FIGS. 3 to 6 are those at a stage after this cutting step.

Figure 7:
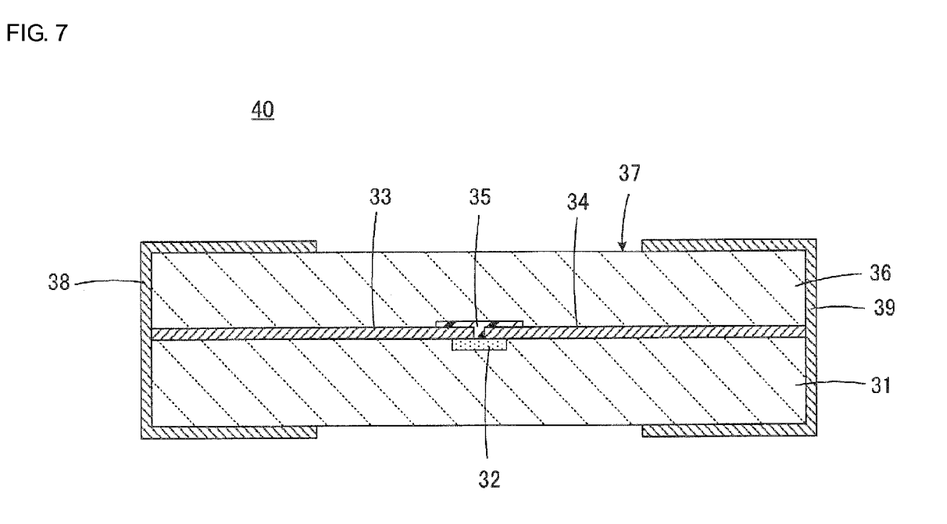
FIG. 7 is a cross-sectional view illustrating a step of producing the ESD protection device 42 prepared in Experimental Example, in which a first green outer terminal electrode 38 and a second green outer terminal electrode 39 are formed after the step illustrated in FIG. 6.

Next, as shown in FIG. 7, the outer terminal electrode paste was applied to outer surfaces of the insulator substrate 37 so as to form a first green outer terminal electrode 38 and a second green outer terminal electrode 39 respectively connected to the first green discharge electrode 33 and the second green discharge electrode 34. As a result, a green ESD protection device 40 was obtained.

(9) Firing

Figure 8:
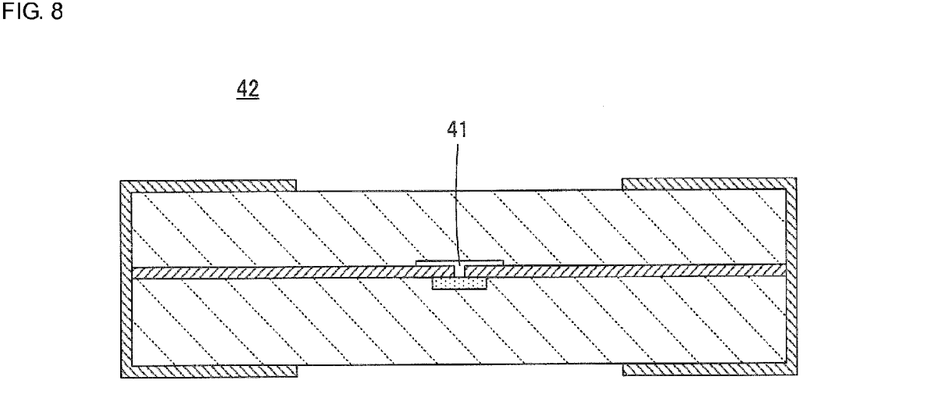
FIG. 8 is a cross-sectional view of the completed ESD protection device 42 obtained by performing a firing step after the step illustrated in FIG. 7.

The green ESD protection device 40 was fired in a firing furnace with an atmosphere controlled by using $N_2/H_2/H_2O$ at an appropriate maximum temperature in the range of 980° C. to 1000° C. As a result, an ESD protection device 42 having a cavity 41 as shown in FIG. 8 was obtained. The atmosphere of the firing furnace was adjusted at an oxygen concentration that did not cause oxidation of Cu from beginning to end.

<Evaluation of Properties>

ESD protection devices related to the samples prepared as described above were evaluated by the methods described below in terms of initial properties, namely, an initial shorting property and a peak voltage property, and reliability properties, namely, a repeated peak voltage property and a repeated shorting property.

(1) Initial Shorting Property

A direct voltage of 50 V was applied between the outer terminal electrodes of the ESD protection device of each sample so as to measure the insulation resistance. Those samples which exhibited an insulation resistance of $10^8\Omega$ or higher were evaluated as having a good initial shorting property and are indicated by "A" in the "Initial shorting" column in Table 6. Those samples which exhibited an insulation resistance less than $10^8\Omega$ were evaluated as having a poor initial shorting property and are indicated by "F" in the aforementioned column.

Note that ESD protection devices evaluated as having poor initial shorting properties were assumed to be unsuitable for practical application and further property evaluation (peak voltage property, repeated peak voltage property, and repeated shorting property) was not performed.

(2) Peak Voltage Property

Static electricity of 15 kV was applied to the ESD protection device of each sample by using an electrostatic test gun. The voltage detected with an oscilloscope during this process was defined to be the peak voltage and those samples which exhibited a peak voltage less than 900 V were evaluated as having a good peak voltage property and are indicated by "A" in the "Peak voltage" column in Table 6. Those samples which exhibited a peak voltage of 900 V or higher were evaluated as having a poor peak voltage property and are indicated by "F" in the aforementioned column.

(3) Repeated Peak Voltage Property

The same instrument used in evaluating the peak voltage property described above was used to apply static electricity of 15 kV 50 times to the ESD protection device of each sample. Upon completion of 50 times of application, static electricity of 15 kV was again applied to measure the peak voltage. Those samples which exhibited a peak voltage less than 900 V were evaluated as having a good repeated peak voltage property and are indicated by "A" in the "Repeated peak voltage" column in Table 6. Those samples which exhibited a peak voltage of 900 V or higher were evaluated as having a poor repeated peak voltage property and are indicated by "F" in the aforementioned column.

(4) Repeated Shorting Property

The same instrument used in evaluating the peak voltage property and the repeated peak voltage property described above was used to apply static electricity of 15 kV 50 times to the ESD protection device of each sample. The insulation resistance of each sample was measured every time the static electricity was applied, and those samples which never exhibited a resistance less than $10^6\Omega$ were evaluated as having a good repeated shorting property and are indicated by "A" in the "Repeated shorting" column in Table 6. Those samples which exhibited a resistance less than $10^6\Omega$ even once were assumed as having a poor repeated shorting property and are indicated by "F" in the aforementioned column.

(5) Comprehensive Evaluation

Those samples which exhibited a good initial shorting property, a good peak voltage property, a good repeated peak voltage property, and a good repeated shoring property were evaluated as suitable for practical application and are indicated by "A" in the "Comprehensive evaluation" column in Table 6. Those samples which performed poorly in at least one of these properties were evaluated as unsuitable for practical application and are indicated by "F" in the "Comprehensive evaluation" column in Table 6.

TABLE 6

| Sample No. | Discharge supporting electrode paste | Initial properties | | Reliability properties | | Comprehensive evaluation |
|---|---|---|---|---|---|---|
| | | Initial shorting | Peak voltage | Repeated peak voltage | Repeated shorting | |
| *1 | S-1 | A | A | F | F | F |
| 2 | S-2 | A | A | A | A | A |
| 3 | S-3 | A | A | A | A | A |
| 4 | S-4 | A | A | A | A | A |
| 5 | S-5 | A | A | A | A | A |
| 6 | S-6 | A | A | A | A | A |
| 7 | S-7 | A | A | A | A | A |
| 8 | S-8 | A | A | A | A | A |
| 9 | S-9 | A | A | A | A | A |
| 10 | S-10 | A | A | A | A | A |
| 11 | S-11 | A | A | A | A | A |
| 12 | S-12 | A | A | A | A | A |
| 13 | S-13 | A | A | A | A | A |
| 14 | S-14 | A | A | A | A | A |
| 15 | S-15 | A | A | A | A | A |
| 16 | S-16 | A | A | A | A | A |
| 17 | S-17 | A | A | A | A | A |
| 18 | S-18 | A | A | A | A | A |
| *19 | S-19 | A | A | F | F | F |
| *20 | S-20 | F | — | — | — | F |
| *21 | S-21 | F | — | — | — | F |
| *22 | S-22 | A | A | F | F | F |
| *23 | S-23 | A | F | F | A | F |
| *24 | S-24 | A | F | F | A | F |
| *25 | S-25 | A | A | F | F | F |
| *26 | S-26 | A | F | F | A | F |
| *27 | S-27 | A | F | F | A | F |

In Table 6, the sample numbers of the samples outside the scope of the present invention are asterisked.

The ESD protection devices of Samples 2 to 18 within the scope of the present invention exhibited good initial properties (initial shorting property and peak voltage property) and good reliability properties (repeated peak voltage property and repeated shorting property) even under application of static electricity with a significantly high voltage. The discharge supporting electrode portions of these samples were observed with SEM. Cu particles, SiC particles, and a glassy substance were observed and the glassy substance was evenly distributed so as to bond between the Cu particles, between the SiC particles, and between the Cu particles and SiC particles.

In contrast, the ESD protection devices of Samples 1, 19, 22, and 25 outside the scope of the present invention exhibited good initial properties but poor reliability properties. The discharge supporting electrode portions of these samples were observed with SEM. Cu particles, SiC particles, and a glassy substance were observed. However, the amount of the glassy substance was smaller than that in the ESD protection devices of Samples 2 to 18 and there were fewer bonds of the glassy substance among the Cu particles and SiC particles. It can be presumed from this observation that Cu particles were scattered by the discharge energy during application of static electricity, leading to deterioration of the repeated peak voltage property and that Cu particles changed their positions, leading to deterioration of the repeated shorting property.

The ESD protection devices of Samples 20 and 21 outside the scope of the present invention exhibited poor initial shorting properties. The discharge supporting electrode portions of these samples were observed with SEM and Cu particles, SiC particles, and a glassy substance were observed. However, Cu particles seemed to have undergone grain growth compared to those in the ESD protection devices of Samples 2 to 18. Presumably, the grain growth of the Cu particles led to poor initial shorting properties.

The ESD protection devices of Samples 23, 24, 26, and 27 outside the scope of the present invention exhibited poor peak voltage properties. The discharge supporting electrode portions of these samples were observed with SEM and Cu particles, SiC particles, and a glassy substance were observed. However, the glassy substance was relatively large and was unevenly segregated. Presumably, the segregated glassy substance inhibited creeping discharge during application of static electricity and deteriorated the peak voltage property.

The total content of the alkali metal carbonate and alkaline earth metal carbonate in the discharge supporting electrode paste used in this Experimental Example is not particularly limited but it has been confirmed that the total content is preferably 0.2% to 2.5% by weight. At a total content less than 0.2% by weight, reliability (repeated peak voltage property and repeated shorting property) tends to be degraded. At a total content exceeding 2.5% by weight, the number of structural defects such as cracking and blistering tends to be increased.

Experimental Example above shows that an ESD protection device that has stable properties and undergoes less deterioration of properties even when static electricity is repeatedly applied can be provided by the present invention. Accordingly, the present invention is widely applicable to a field of ESD protection devices used to protect various devices and apparatuses including semiconductor devices.

11, 11a, 42 ESD protection device
12 insulator substrate
16, 17 discharge electrode
18 discharge supporting electrode
19, 41 cavity
20, 21 outer terminal electrode
31, 36 ceramic green sheet
32 green discharge supporting electrode
33, 34 green discharge electrode
35 green combustibly removable layer
37 green insulator substrate
38, 39 green outer terminal electrode
40 green ESD protection device
G gap

The invention claimed is:

1. An ESD protection device comprising:
a first discharge electrode and a second discharge electrode arranged to oppose each other;
a discharge supporting electrode formed so as to span between the first and second discharge electrodes; and
an insulator substrate that retains the first and second discharge electrodes and the discharge supporting electrode,
wherein the discharge supporting electrode contains a plurality of metal particles and a glass that bonds between the metal particles, and
the glass contains an alkali metal component and/or an alkaline earth metal component.

2. The ESD protection device according to claim 1, wherein the discharge supporting electrode further contains a network-forming oxide adhered to surfaces of the metal particles.

3. The ESD protection device according to claim 1, wherein the discharge supporting electrode further contains silicon carbide.

4. The ESD protection device according to claim 1, wherein the metal particles comprise copper or a copper alloy containing copper as a main component.

5. The ESD protection device according to claim 1, wherein the first and second discharge electrodes and the discharge supporting electrode are positioned inside the insulator substrate, the insulator substrate has a cavity where a gap between the first and second discharge electrodes lies, and the ESD protection device further comprises a first outer terminal electrode and a second outer terminal electrode which are formed on a surface of or another surface of the insulator substrate and respectively electrically connected to the first and second discharge electrodes.

6. A method for producing an ESD protection device, the method comprising:
a step of preparing an insulator substrate;
a step of preparing a discharge supporting electrode paste that contains, in addition to a powder of an alkali metal compound and/or an alkaline earth metal compound, (1) a metal powder with a network-forming oxide adhered to particle surfaces, (2) a metal powder and a semiconductor powder with a network-forming oxide adhered to particle surfaces, or (3) a metal powder with a network-forming oxide adhered to particle surfaces and a semiconductor powder with a network-forming oxide adhered to particle surfaces;
a step of forming a green discharge supporting electrode formed of the discharging supporting electrode paste on a surface of or inside the insulator substrate;
a step of forming a first discharge electrode and a second discharge electrode on the surface of, another surface of, or inside the insulator substrate so that the first and second discharge electrodes oppose each other on the discharge supporting electrode; and
a step of firing the green discharge supporting electrode.

7. The method for producing an ESD protection device according to claim 6, wherein the semiconductor powder is a silicon carbide powder.

8. The method for producing an ESD protection device according to claim 6, wherein the alkali metal compound and the alkaline earth metal compound are carbonate.

9. The method for producing an ESD protection device according to claim 8, wherein a total content of the alkali metal carbonate and the alkaline earth metal carbonate in the discharge supporting electrode paste is 0.2% to 2.5% by weight.

10. The method for producing an ESD protection device according to claim 6, wherein
the step of preparing the insulator substrate includes a step of preparing a plurality of ceramic green sheets including a first ceramic green sheet and a second ceramic green sheet,
the step of forming the green discharge supporting electrode and the step of forming the first discharge electrode and the second discharge electrode are performed on the first ceramic green sheet,
the method further comprises:
a step of forming a combustibly removable layer so as to cover a gap between the first and second discharge electrodes;
a step of obtaining the insulator substrate in a green state by stacking the second ceramic green sheet on the first ceramic green sheet so as to cover the green discharge supporting electrode, the first and second discharge electrodes, and the combustibly removable layer; and
a step of forming a first outer terminal electrode and a second outer terminal electrode, which are respectively electrically connected to the first and second discharge electrodes, on the surface of or another surface of the insulator substrate, and
the firing step includes a step of obtaining the insulator substrate by sintering the ceramic green sheets and a step of combustibly removing the combustibly removable layer.

11. The ESD protection device according to claim 2, wherein the discharge supporting electrode further contains silicon carbide.

12. The ESD protection device according to claim 2, wherein the metal particles comprise copper or a copper alloy containing copper as a main component.

13. The ESD protection device according to claim 3, wherein the metal particles comprise copper or a copper alloy containing copper as a main component.

14. The ESD protection device according to claim 2, wherein the first and second discharge electrodes and the discharge supporting electrode are positioned inside the insulator substrate, the insulator substrate has a cavity where a gap between the first and second discharge electrodes lies, and the ESD protection device further comprises a first outer terminal electrode and a second outer terminal electrode which are formed on a surface of or another surface of the insulator substrate and respectively electrically connected to the first and second discharge electrodes.

15. The ESD protection device according to claim 3, wherein the first and second discharge electrodes and the discharge supporting electrode are positioned inside the insulator substrate, the insulator substrate has a cavity where a gap between the first and second discharge electrodes lies, and the ESD protection device further comprises a first outer terminal electrode and a second outer terminal electrode which are formed on a surface of or another surface of the insulator substrate and respectively electrically connected to the first and second discharge electrodes.

16. The ESD protection device according to claim 4, wherein the first and second discharge electrodes and the discharge supporting electrode are positioned inside the insulator substrate, the insulator substrate has a cavity where a gap between the first and second discharge electrodes lies, and the ESD protection device further comprises a first outer terminal electrode and a second outer terminal electrode which are formed on a surface of or another surface of the insulator substrate and respectively electrically connected to the first and second discharge electrodes.

17. The method for producing an ESD protection device according to claim 7, wherein the alkali metal compound and the alkaline earth metal compound are carbonate.

18. The method for producing an ESD protection device according to claim 7, wherein
the step of preparing the insulator substrate includes a step of preparing a plurality of ceramic green sheets including a first ceramic green sheet and a second ceramic green sheet,
the step of forming the green discharge supporting electrode and the step of forming the first discharge electrode and the second discharge electrode are performed on the first ceramic green sheet,
the method further comprises:
a step of forming a combustibly removable layer so as to cover a gap between the first and second discharge electrodes;
a step of obtaining the insulator substrate in a green state by stacking the second ceramic green sheet on the first ceramic green sheet so as to cover the green discharge supporting electrode, the first and second discharge electrodes, and the combustibly removable layer; and
a step of forming a first outer terminal electrode and a second outer terminal electrode, which are respectively electrically connected to the first and second discharge electrodes, on the surface of or another surface of the insulator substrate, and
the firing step includes a step of obtaining the insulator substrate by sintering the ceramic green sheets and a step of combustibly removing the combustibly removable layer.

19. The method for producing an ESD protection device according to claim 8, wherein
the step of preparing the insulator substrate includes a step of preparing a plurality of ceramic green sheets including a first ceramic green sheet and a second ceramic green sheet,
the step of forming the green discharge supporting electrode and the step of forming the first discharge electrode and the second discharge electrode are performed on the first ceramic green sheet,
the method further comprises:
a step of forming a combustibly removable layer so as to cover a gap between the first and second discharge electrodes;
a step of obtaining the insulator substrate in a green state by stacking the second ceramic green sheet on the first ceramic green sheet so as to cover the green discharge supporting electrode, the first and second discharge electrodes, and the combustibly removable layer; and
a step of forming a first outer terminal electrode and a second outer terminal electrode, which are respectively electrically connected to the first and second discharge electrodes, on the surface of or another surface of the insulator substrate, and
the firing step includes a step of obtaining the insulator substrate by sintering the ceramic green sheets and a step of combustibly removing the combustibly removable layer.

20. The method for producing an ESD protection device according to claim 9, wherein
- the step of preparing the insulator substrate includes a step of preparing a plurality of ceramic green sheets including a first ceramic green sheet and a second ceramic green sheet,
- the step of forming the green discharge supporting electrode and the step of forming the first discharge electrode and the second discharge electrode are performed on the first ceramic green sheet,
- the method further comprises:
- a step of forming a combustibly removable layer so as to cover a gap between the first and second discharge electrodes;
- a step of obtaining the insulator substrate in a green state by stacking the second ceramic green sheet on the first ceramic green sheet so as to cover the green discharge supporting electrode, the first and second discharge electrodes, and the combustibly removable layer; and
- a step of forming a first outer terminal electrode and a second outer terminal electrode, which are respectively electrically connected to the first and second discharge electrodes, on the surface of or another surface of the insulator substrate, and
- the firing step includes a step of obtaining the insulator substrate by sintering the ceramic green sheets and a step of combustibly removing the combustibly removable layer.

* * * * *